United States Patent [19]
Allen et al.

[11] Patent Number: 4,559,091
[45] Date of Patent: Dec. 17, 1985

[54] METHOD FOR PRODUCING HYPERABRUPT DOPING PROFILES IN SEMICONDUCTORS

[75] Inventors: Frederick G. Allen; Dwight C. Streit, both of Los Angeles; Robert A. Metzger, Northridge, all of Calif.

[73] Assignee: Regents of the University of California, Berkeley, Calif.

[21] Appl. No.: 620,917

[22] Filed: Jun. 15, 1984

[51] Int. Cl.[4] ............... H01L 21/365; H01L 21/477
[52] U.S. Cl. ................................. 148/174; 148/175; 29/576 E
[58] Field of Search ............... 148/174, 175; 29/576 E

[56] References Cited

U.S. PATENT DOCUMENTS

| | | | |
|---|---|---|---|
| 2,809,165 | 10/1957 | Jenny | 252/62.3 |
| 2,841,509 | 7/1958 | Jensen et al. | 148/1.5 |
| 2,841,559 | 7/1958 | Rosi | 252/62.3 |
| 3,036,898 | 5/1962 | Brock et al. | 75/65 ZM |
| 3,442,775 | 5/1969 | Wilkes et al. | 204/37 |
| 3,459,152 | 8/1969 | Garrison et al. | 118/5 |
| 3,600,242 | 8/1971 | Berkenblit et al. | 148/175 |
| 3,669,769 | 6/1972 | Badami et al. | 148/175 |
| 3,765,940 | 10/1973 | Hentzschel | 148/175 X |
| 4,012,235 | 3/1977 | Mayer et al. | 148/DIG. 154 |
| 4,226,648 | 10/1980 | Goodwin et al. | 148/175 |
| 4,270,960 | 6/1981 | Bollen et al. | 148/174 X |
| 4,319,954 | 3/1982 | White et al. | 148/DIG. 1 |
| 4,402,762 | 9/1983 | John et al. | 148/174 X |
| 4,485,128 | 11/1984 | Dalal et al. | 148/174 X |
| 4,509,990 | 4/1985 | Vasuder | 29/571 B X |

OTHER PUBLICATIONS

Kunii et al., J. Appl. Phys. 54(5), May 1983, pp. 2847–2849.

Primary Examiner—George T. Ozaki
Attorney, Agent, or Firm—Poms, Smith, Lande & Rose

[57] ABSTRACT

A method for achieving extreme and arbitrary doping profiles in semiconductors with dopant concentrations varying over orders of magnitude in a few atomic layers. The method involves evaporating the semiconductor, along with the desired amounts of n- or p- dopants onto an atomically clean substrate semiconductor surface in an ultrahigh vacuum environment at low temperatures such that an amorphous film results. The amorphous film is then crystallized epitaxially by a solid phase epitaxy, thereby providing a single crystal with the desired dopant profile. Multiple profile changes or grading may be included in the semiconductor film by varying dopant concentrations in the amorphous layer as desired.

11 Claims, 5 Drawing Figures p+ dopant plane
35-50 Å thick
$N_a = 3\text{-}5 \times 10^{18} \text{cm}^{-3}$ Energy bands at zero bias

METHOD FOR PRODUCING HYPERABRUPT DOPING PROFILES IN SEMICONDUCTORS

FIELD OF THE INVENTION

The present invention relates generally to methods of doping semiconductors and specifically to methods of doping semiconductors to achieve arbitrary doping profiles.

BACKGROUND OF THE INVENTION

Arbritrary doping profiles in semiconductors with depth control to a few monolayers and exact control of n- and p- dopant levels to a few percent with no diffusional smearing are needed to fabricate new devices. Such doping profiles will, in many instances, be "hyperabrupt;" that is, having extreme profile changes. Examples of such devices are triangular barrier diodes, high-speed logic switches, mixers, fast photodiodes, BARITT devices and thermionic emission transistors.

Presently known doping methods used to achieve arbitrary profiles have primarily involved molecular beam epitaxy (MBE). With conventional MBE, silicon is doped either by evaporating antimony (n) or gallium (p), or by directing low-energy ionized beams of boron or arsenic into the growing silicon surface held at 700°–900° C. Evaporative doping suffers from low sticking coefficients, extreme temperature sensitivity, and transient smearing effects. Ion embedding is likewise cumbersome, and the resultant damage must be carefully annealed out. As yet, neither method has demonstrated good mobility at doping levels higher than $5 \times 10^{18}$ cm$^{-3}$ in either p- or n-type material.

Solid phase epitaxy (SPE), involving regrowth of deposited amorphous semiconductors with co-evaporated dopants from either doped semiconductor sources or separate dopant sources, is known in the art. Such techniques, however, have not been successfully applied to the growth of semiconductor layers with arbitrary profiles, and in particular have not been successfully applied to produce hyperabrupt profiles. A technique which could successfully produce hyperabrupt junctions would find wide commercial applicability.

Accordingly, it is a principal object of the present invention to achieve hyperabrupt doping profiles in semiconductors.

It is another object of the present invention to achieve such profiles utilizing SPE regeneration of doped amorphous films.

Yet another object of the present invention is to utilize SPE to produce hyperabrupt junctions with: no smearing, unity sticking coefficients, greater than solid solubility limits, good electrical mobility, and good crystal quality.

A further object of the present invention is to allow arbitrary dopant control to a few atomic layers.

SUMMARY OF THE INVENTION

The present invention, in a broad aspect, provides a method for achieving extreme doping profiles, with dopant concentrations varying over orders of magnitude within a few atomic layers. The method involves evaporating the semiconductor, along with the desired amounts of n- or p-type dopants, onto an atomically clean substrate semiconductor surface in an ultrahigh vacuum (UHV) environment at a low temperature such that an amorphous film results. The amorphous film is then crystallized epitaxially via solid phase epitaxy, thereby providing a single crystal with the desired dopant profile.

In accordance with one feature of the invention, multiple profile changes or grading may be included in the semiconductor film by varying dopant concentrations in the amorphous layer as desired.

In accordance with other features of the invention, no diffusional smearing of the dopant occurs either during deposition or regrowth because of the low temperatures involved. Higher doping concentrations can also be achieved this way rather than by evaporation of the dopant onto a heated surface is encountered in conventional MBE. Furthermore, since all dopant atoms stick and are incorporated, good level control results with no transient effects.

In accordance with still other features of the invention, the method of the present invention has applicability to growing atomic super-lattices, new heterojunctions, as well as new alloys and crystals.

Other objects, features, and advantages of the present invention will become apparent from a consideration of the following detailed description, and the accompanying drawings.

DETAILED DESCRIPTION

Figure 1:
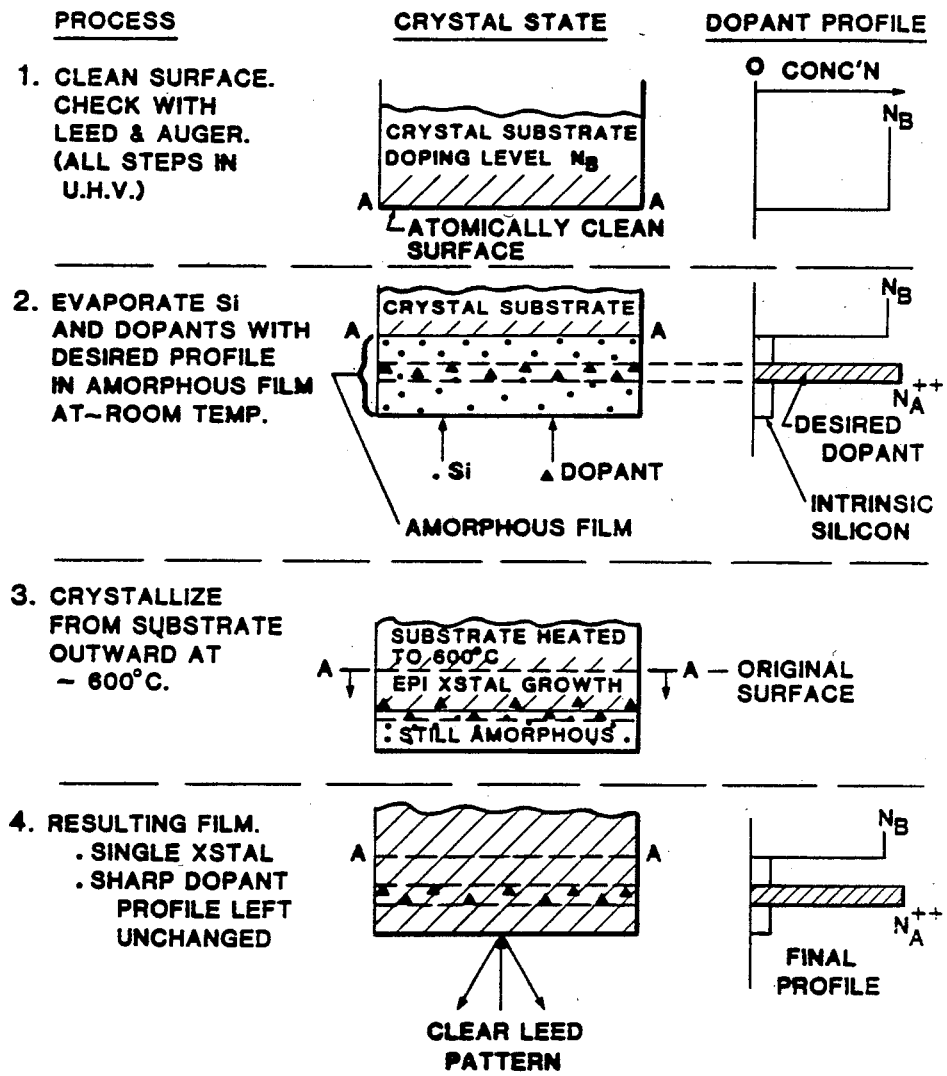
FIG. 1 shows a diagram of the method of the present invention.

Referring more particularly to the drawings, FIG. 1 shows the method of the present invention. The method of the present invention is as follows. First, the surface of the semiconductor substrate is made sufficiently clean on an atomic scale in an UHV environment, in order to permit subsequent defect-free epitaxial growth. Typical pressures involved in the UHV environment are less than $10^{-10}$ Torr. The substrate is maintained in this condition long enough to begin the next step: deposition.

Second, a semiconductor film is deposited onto the clean substrate in the UHV at room temperature. Conventional methods of deposition, such as evaporation, can be used. Substrate temperature is held below that at which epitaxial growth occurs (e.g., less than 350° C. for silicon), so that the film is deposited in an amorphous form with no voids. Unwanted impurities are minimized by maintaining a very high ratio between the incident flux rate of the simiconductor and that of any ambient gas.

Dopants are incorporated into the growing amorphous film in desired concentrations by co-deposition using a known dopant/semiconductor flux ratio. All of the incident dopant atoms "stick" to the surface. The kinetic effects associated with dopant incorporation during high-temperature epitaxial growth that may smear dopant profiles and prohibit the changes in dopant concentration are avoided using low-temperature amorphous deposition. The co-deposition may be by conventional means, such as by co-evaporation.

Multiple profile changes or grading may be included in the semiconductor film by varying dopant concentration in the amorphous layer as desired. Dopant spikes with changes of many orders of magnitude in concentration in only a few atomic layers are possible. These profile changes are limited only by the dopant/semiconductor flux ratios, rather than by dopant incorporation kinetics. Supersaturated solutions are also achievable with the appropriate dopant concentrations.

Third, the amorphous film is subsequently crystallized epitaxially via SPE, outwardly from the substrate. The regrowth grate is exponentially dependent on temperature, with reasonable regrowth rates (e.g., one micron in 30 minutes) occurring in the 500°–600° C. range. Dopants become 100% electrically active as they are incorporated into substitutional lattice sites during the regrowth process. Supersaturated solutions remain stable if the regrowth temperature is below that where dopant preciptiation is initiated.

The foregoing technique will allow the creation of hyperabrupt doping profiles in semiconductors. A detailed description of experimental results using this technique is provided below using the co-evaporation of n- or p- type dopants and silicon onto a silicon substrate. The present invention, however, is not limited to silicon, and other elemental semiconductors such as germanium and compound semiconductors such as the III–V and II–VI families could be deposited in correct stoichiometric proportions along with desired dopants and later recrystallized epitaxially from the initially clean substrate.

Lateral circuit patterns can also be formed by evaporating the dopants through masks. Another application of this technique is the growth of good semiconductor films on insulators. An example is the deposition of an amorphous film or silicon doped as desired onto a previously clean substrate of a single crystal insulator such as sapphire, at room temperature in high vacuum. Recrystallization of the silicon film under 600° C. can provide the lowest temperature growth possible for good silicon-on-sapphire films.

The foregoing technique is the first use of SPE as a means for producing hyperabrupt doping profiles with no smearing by any process and with: dopant control to the atomic layer dimension, unity sticking coefficients, greater than solid solubility limits, good electrical mobility and crystal quality. The foregoing method is also a means for introducing new elements into growing crystals not feasible otherwise, either for the purposes of doping, growth of hetero-structures, or desired alloys. This technique is applicable to semicondutors or metals.

Additionally, with the foregoing technique, no diffusional smearing of the dopant occurs either during deposition or regrowth because of the very low temperatures involved. Higher doping concentrations can be achieved with the present invention, rather than by evaporation by dopants onto heated substrates as is done during normal MBE. Since all of the dopant atoms stick and are incorporated into the lattice, good level control results with no transient effects.

Furthermore, the doping profiles achievable with the present invention can be entirely arbitrary in shape or in sequence.

Figure 2:
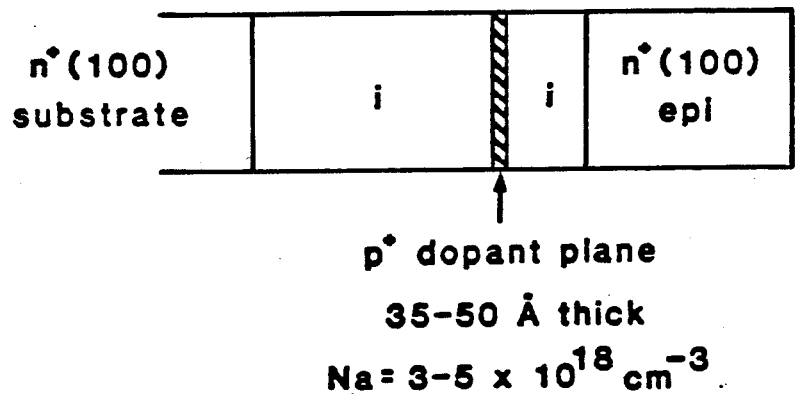
FIG. 2 shows a triangular barrier diode made with the method of the present invention.
Figure 2:
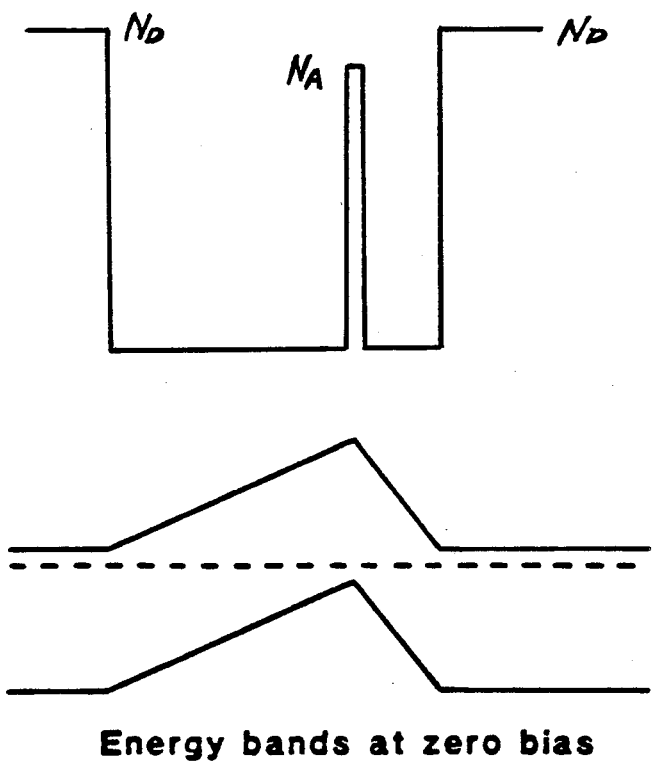

FIG. 2 shows a triangular barrier diode produced with the method of the present invention, along with the dopant profile and energy band diagram.

Figure 3:
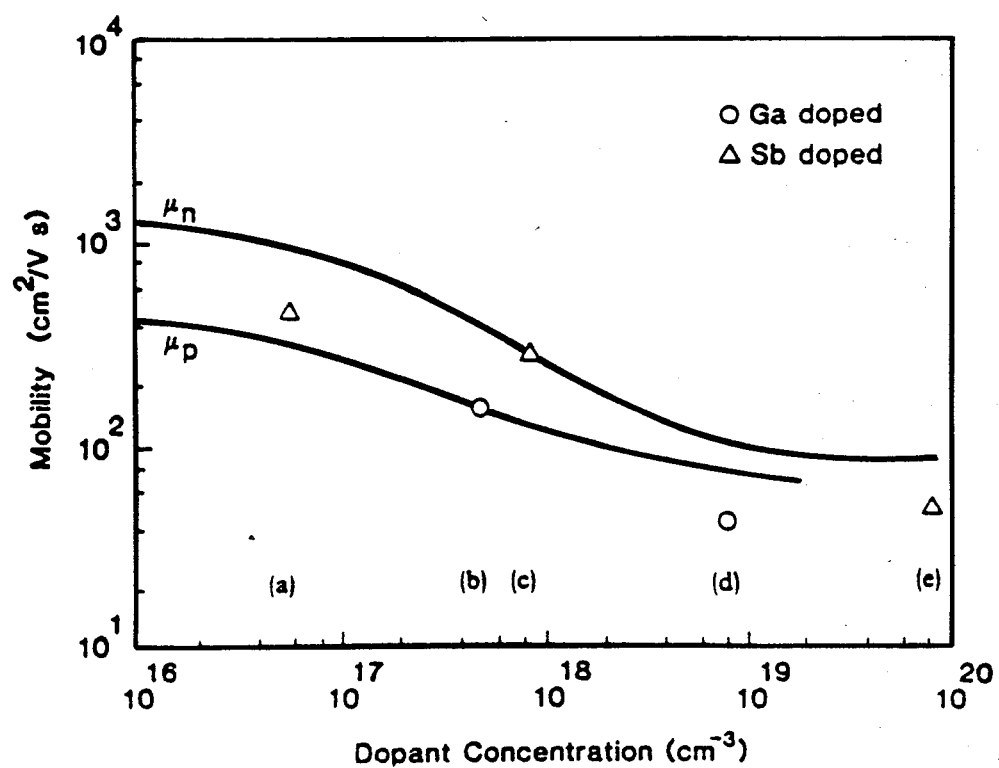
FIG. 3 is a graph of the Hall mobility results on SPE-grown silicon films according to the present invention.

Turning next to experimental results using the method of the present invention, the experiments involved evaporative doping by gallium (Ga) and antimony (Sb) during deposition of amorphous silicon at room temperature, followed by solid phase crystallization by heating the substrate, all in UHV. Reference will be made to FIG. 3, which shows Hall mobility results in SPE-grown films doped with (a) $5.6 \times 10^{16}$ cm$^{-3}$ Sb (SPE No. 5); (b) $4.3 \times 10^{17}$ cm$^{-3}$ Ga (SPE No. 3); (c) $9.2 \times 10^{17}$ cm$^{-3}$ Sb (SPE. No. 4); (d) $8 \times 10^{18}$ cm$^{-3}$ Ga (SPE No. 2); and (e) $8.2 \times 10^{19}$ cm$^{-3}$ Sb (SPE No. 8). All the data are superimposed on bulk values.

Figure 4:
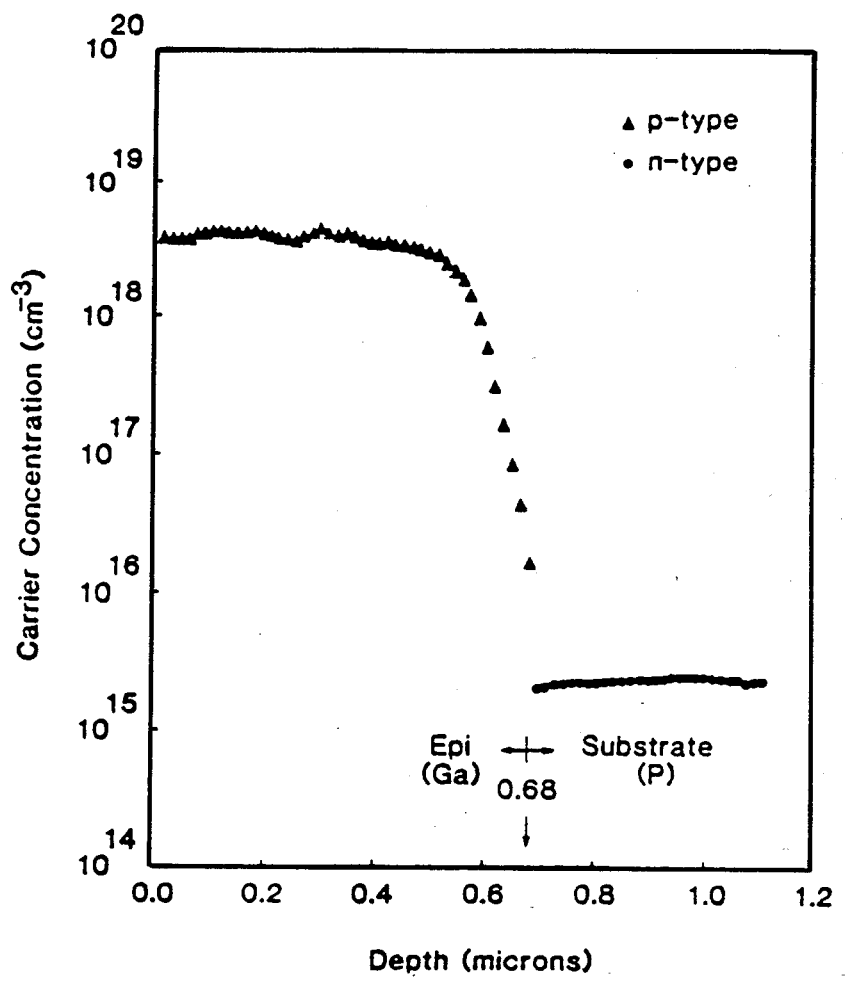
FIG. 4 is a graph of the spreading resistance results on an SPE-grown film according to the present invention.

FIG. 4 shows spreading resistance results on the SPE-grown film (SPE No. 2). The bulk mobility was assumed in calculating carrier concentration from measured resistance. The bevel angle was 0.006 radians; the probe tip radius was 1 micron; and the probe load was 5 grams.

Figure 5:
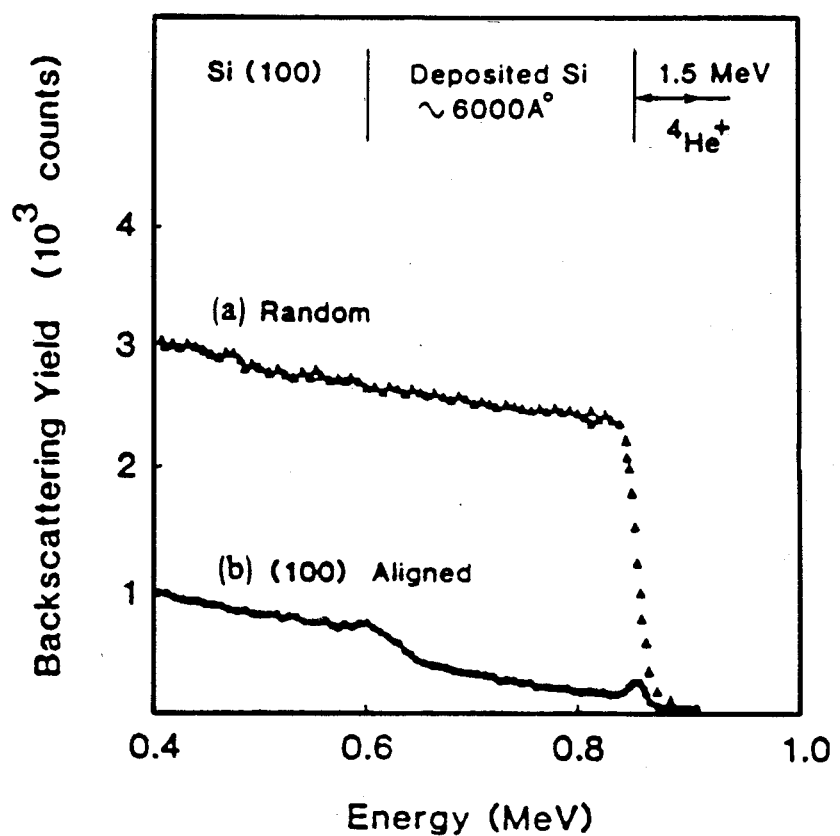
FIG. 5 is a graph of reflection backscattering spectra for random silicon and for an SPE-grown film according to the present invention.

FIG. 5 shows reflection backscattering spectra for (a) random silicon and (b) an SPE-grown film (SPE No. 2).

In the experiments with the method described herein, amorphous silicon films were grown at room temperature in a modified Varian UHV system equipped with ion pumps and titanium gettering. Silicon was electron beam evaporated from a 3000-Ωcm source. Low-energy electron diffraction (LEED) and Auger electron spectroscopy (AES) were used to characterize the silicon surfaces. Base pressures were $10^{-10}$ Torr and growth pressures were typically $1-3 \times 10^{-9}$ Torr. Substrate temperatures were measured by IR pyrometry.

Lightly doped (100) silicon substrates, either $1 \times 3$ cm rectangles or 2-in. wafers, were chemically cleaned and then loaded into the vacuum system via a sample transfer load lock. The samples were heated to 1200° C. for approximately 2 minutes to desorb any residual oxides or contaminants until a sharp $2 \times 1$ LEED pattern resulted. The rectangular substrates were heated by passing current through the sample, while the 2-in. wafers were radiantly heated from behind using tantalum filaments, assisted by 1000-V electron bombardment. AES indicated no detectable oxygen contamination, but both AES and SIMS results have shown that the silicon surfaces cleaned only by heating in UHV often have carbon contamination at a fraction of one monolayer.

Immediately following the 1200° C. cleaning the substrate heater power was turned to zero, the substrate cooled to room temperature and the substrate was turned into the silicon beam. After 200Å of silicon growth the desired dopant oven shutter was opened, and either Sb or Ga evaporated from calibrated ovens onto the growing silicon film. Total film thickness was 0.6–0.7 μm, with an average silicon growth rate of 2Å/s.

The deposited amorphous films were crystallized in situ at 530°–630° C. The regrowth was monitored using LEED; when the amorphous-crystalline interface reached the surface a sharp $2 \times 1$ LEED pattern was observed after cooling to room temperature.

Resistivity and Hall measurements were made on the recrystallized films, isolated from their substrates by p-n junctions, using the van de Pauw technique.

The measured average regrowth rate for the (100) surface at 575° C., determined from the time required to develop a good LEED pattern after regrowth of a 0.6-μm film, was 3.8Å/s (230Å/min.). This agrees very closely with a value of 2.0+1.Å/s obtained from self-implanted amorphous films, both by laser and furnace induced regrowth. Over the range of Sb and Ga doping investigated, no significant effect of doping on regrowth velocity was found.

The table displays the experimental data and results obtained with five different regrowth films. For all five films in the table, the Hall data disclosed dopant values for both Sb and Ga approximately as high or higher than the calibrated density of deposited dopant from flux calibrations. If S is defined as the "sticking coefficient" for deposited dopant, meaning the fraction that became electrically active of the total number evaporated. From these values, S varied from a low of 0.77 for No. 5 to a high of 4.6 for No. 4. Uncertainty in vapor pressure and exact temperature of effusion ovens explains apparent values of S greater than 1. Within this uncertainty, it is concluded that all Sb and Ga atoms evaporated on the amorphous Si(100) surface at room temperature stick, and become incorporated as active dopants. This is in marked contrast to the case for normal evaporative doping during MBE growth by Sb and Ga at growth temperatures above 650 degrees C where S may be as low as $10^{-4}$.

resistance depends on the mobility assumed and was uncertain to a factor of 2. The small variations in doping level can be attributed to the manual control of the Ga and Si sources. The epitaxial interface appears as the sharp rise from n to p at 0.68 $\mu$m. The transition to full $N_A$ value appears spread over approximately 2000Å in the epitaxial film. This is believed to be due to the spreading resistance technique, which measures the tip of a thin wedge of p-type material bevelled at 0.006 radians, on top of the n-type substrate before it crosses the junction. It is believed the actual doping transition from n to p+ was very sharp.

Rutherford backscattering (RBS) measurements were made using 1.5-MeV$^4$ 4He+ ions on two samples, the first of which (SPE No. 6) disclosed some remaining amorphous structure. The second, SPE No. 2, gave the spectra shown in FIG. 5.

The ratio of the minimum (100) aligned yield to the random yield of the epilayer gave $X_{min}$=4.2%. The abscissa was labeled in energy using a small carbon peak found at the surface of a control sample and the silicon surface peak energies (378.9 and 848.46 keV).

The vaLue of 4.2% is a sensitive measure of the crystalline perfection of the epitaxial film. The best reported

| Sample | SPE No. 2 | SPE No. 3 | SPE No. 4 | SPE No. 5 | SPE No. 6 |
| --- | --- | --- | --- | --- | --- |
| Substrate | 2 Ω cm P doped | 2 Ω cm P doped | 20 Ω cm B doped | 20 Ω cm B doped | 40 Ω cm B doped |
| Film thickness | 0.6$\mu$ | 0.6$\mu$ | 0.6$\mu$ | 0.6$\mu$ | 0.6$\mu$ |
| Dopant and calculated level (cm$^{-3}$) | Ga, 1 × 10$^{19}$ | Ga, 4.7 × 10$^{17}$ | Sb, 2 × 10$^{17}$ | Sb, 7.3 × 10$^{16}$ | Sb, 4 × 10$^{19}$ |
| Hall data on film: | | | | | |
| doping, $\eta$ or $\rho$ (cm$^{-3}$) | 8 × 10$^{18}$ | 4.3 × 10$^{17}$ | 9.2 × 10$^{17}$ | 5.6 × 10$^{16}$ | 8.2 × 10$^{19}$ |
| mobility, $\mu_\eta$ or $\mu_\rho$ (cm$^2$/Vs) | 41 | 171 | 284 | 463 | 51 |
| resistivity, $\rho$ (Ω cm) | 0.019 | 0.085 | 0.024 | 0.24 | 0.0015 |
| Fractional mobility, $\mu/\mu_g$ | 0.56 | 1.07 | 1.01 | 0.50 | 0.57 |
| LEED after regrowth | Sharp 2 × 1 | Sharp 2 × 1 | Sharp 2 × 1 | Faint 2 × 1 | Not observed |

As shown in the table, the Hall results indicated doping levels up to 8×10$^{18}$ for Ga and 8.2×10$^{19}$ cm$^{-3}$ for Sb. These are about four times higher than the highest values that have been achieved during evaporative doping in normal silicon MBE growth at 700° C., and exceed the reported solid solubility limits of 9×10$^{18}$ (for Ga) and 2×10$^{19}$ cm$^{-3}$ (for Sb) at 700 degrees C. Previous results both by regrowth via vacuum heating of the substrate and by laser crystallization indicate that maximum concentration with solid phase epitaxy should be very high.

The measured Hall mobility and resistivity values on these five samples are shown in the table. The Hall results are shown superimposed on good bulk mobility data in FIG. 3. It is seen that at intermediate doping levels, 10$^{17}$–10$^{18}$ cm$^{-3}$ of both Sb and Ga, bulk mobility is achieved, but that it falls off at both higher and lower values. These mobilities at high doping levels are superior to values that have been achieved with evaporative doping during normal MBE growth, where on 50% of bulk mobility at the highest levels of 2×10$^{18}$ and 2.5×10$^{19}$ cm$^{-3}$ of Ga and Sb, respectively is found. The lowest resulting resistivity values, of interest for ohmic contact regions of devices such as solar cells and IMPATT diodes, are seen to be 0.019 cm for Ga and 0.0015Ω for Sb.

Spreading resistance measurements made on SPE No. 2 shown in FIG. 4 show a fairly uniform doping level of ~4×10$^{18}$ cm$^{-3}$ throughout the 0.6 $\mu$m film. The absolute value of this level derived from spreading values for the silicon (100) aligned/random ratio in very perfect crystals are approximately 3.0%. Hence, while the epitaxial film is not perfect by this criterion, it is very good.

The height of the surface peak is related to surface disorder. The spectrum of FIG. 3 shows a surface peak height for the aligned crystal that compares favorably with virgin (100) data.

The sudden rise at the interface probably indicates disorder near the substrate/epilayer interface.

Transmission electron microscopy views of the regrown epitaxial films, using jet etch techniques to produce thin tapered edges in which the electron beam sees only the epitaxial film, have shown both good crystalline regions (<10$^3$ dislocations/cm2) and bad regions (>10$^5$/cm2).

In conclusion, solid phase epitaxial regrowth is carried out by substrate heating to 575° C. following amorphous deposition of silicon at room temperature in ultrahigh vacuum. This provices a valuable new technique for evaporative doping by Sb and Ga during the silicon deposition, when all dopant atoms "stick" and later become incorporated as active dopant. Doping levels achieved by SPE are four times higher than have been reached during conventional high-temperatures MBE growth. Mobility matches good bulk values from 10$^{17}$ to 10$^{18}$ cm$^{-3}$ doping levels, but falls below at both higher and lower levels. RBS channeling spectra show high crystal quality. Since no dopant diffusion, redistribution, or carry-over is expected at these low regrowth temperatures, this technique should be valuable in growing sharp, arbitrary profiles at all doping levels.

In the foregoing description of the present invention, a preferred embodiment of the invention has been disclosed. It is to be understood that other variations and enhancements to the present invention are within the scope of the present invention. Accordingly, the present invention is not limited to the particular embodiment which has been discussed in detail herein.

What is claimed is:

1. A method for producing arbitrary doping profiles in a semiconductor, comprising:
   simultaneously depositing an amorphous layer of a semiconductor and a dopant onto an atomically clean semiconductor substrate; and
   epitaxially crystallizing said amorphous layer to produce an epitaxial film on said substrate, with the doping profile of said epitaxial film being determined by the concentration of said dopant in said amorphous layer.

2. A method for producing hyperabrupt doping profiles in semiconductors, comprising:
   cleaning a substrate semiconductor surface on an atomic scale;
   depositing a semiconductor film in an amorphous form onto said substrate, thereby producing a growing amorphous layer;
   co-depositing a dopant in said amorphous layer as said layer is growing; and
   epitaxially crystallizing said amorphous layer to produce an epitaxial film, whereby an epitaxial film is produced on said substrate with the doping profile in said film being determined by the concentration of said dopant.

3. A method as defined in claim 2, wherein said method comprises the additional step of:
   minimizing unwanted impurities in said amorphous layer by maintaining a high ratio between the incident flux rate of said semiconductor and that of any ambient gas present during said depositing step and said co-depositing step.

4. A method as defined in claims 1 or 2, wherein: said method is performed in an ultrahigh vacuum environment.

5. A method as defined in claims 1 or 2, wherein: said method is performed in an environment having a pressure less than $10^{-10}$ Torr.

6. A method as defined in claims 1 or 2, wherein: said step of depositing is performed with said substrate being held at a temperature below that at which epitaxial growth occurs.

7. A method as defined in claims 1 or 2, wherein said step of crystallizing comprises: solid phase epitaxial regrowing.

8. A method as defined in claims 1 or 2, wherein: said step of crystallizing is performed at a temperature in the range of 500°–600° C.

9. A method as defined in claims 1 or 2 wherein said method comprises the additional step of:
   minimizing unwanted impurities in said amorphous layer by maintaining a high ratio between the incident flux rate of said semiconductor and any ambient gas present during said step of depositing.

10. A method as defined in claim 1, wherein: said step of depositing includes the preliminary step of cleaning said surface of said semiconductor substrate on an atomic scale to permit subsequent defect-free epitaxial growth.

11. A method as defined in claim 1, wherein: said step of simultaneously depositing includes the step of effecting a plurality of changes in said profile by varying the concentration of the dopant in said amorphous layer.

* * * * *